(12) United States Patent
Blank et al.

(10) Patent No.: US 7,048,316 B1
(45) Date of Patent: May 23, 2006

(54) COMPOUND ANGLED PAD END-EFFECTOR

(75) Inventors: Richard Blank, Sunnyvale, CA (US); Simon Chan, Campbell, CA (US); Edmund Minshall, Sherwood, OR (US); Peter Woytowitz, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 534 days.

(21) Appl. No.: 10/194,529

(22) Filed: Jul. 12, 2002

(51) Int. Cl.
*B66C 1/00* (2006.01)

(52) U.S. Cl. .......................... 294/1.1; 294/902; 901/30; 414/941; 414/935

(58) Field of Classification Search ................ 294/1.1, 294/902; 901/30; 414/935, 936, 937, 941
See application file for complete search history.

(56) References Cited

U.S. PATENT DOCUMENTS

| | | | |
|---|---|---|---|
| 5,669,644 A * | 9/1997 | Kaihotsu et al. | 294/1.1 |
| 6,318,957 B1 * | 11/2001 | Carr et al. | 414/810 |
| 6,537,011 B1 * | 3/2003 | Wang et al. | 414/217 |
| 6,634,686 B1 * | 10/2003 | Hosokawa | 294/1.1 |
| 6,709,218 B1 * | 3/2004 | Freerks et al. | 414/217 |
| 6,729,834 B1 * | 5/2004 | McKinley | 414/754 |
| 2002/0041102 A1 * | 4/2002 | Krauskopf et al. | 294/1.1 |
| 2002/0071756 A1 * | 6/2002 | Gonzalez | 414/941 |
| 2003/0085582 A1 * | 5/2003 | Woodruff et al. | 294/103.1 |

* cited by examiner

*Primary Examiner*—Eileen D. Lillis
*Assistant Examiner*—Michael Lowe
(74) *Attorney, Agent, or Firm*—DeLio & Peterson, LLC

(57) ABSTRACT

This invention provides a method and a support device for a wafer transfer process which has a first vertical, second horizontal and third compound angled surfaces, as well as a pair of sidewalls all contiguously connected to one another. The third surface has at least two angled receiving surfaces whereby one of such angled receiving surfaces has a small angle of incline for initially receiving and delivering a wafer. The other angled receiving surface has a steep angle of incline for effectively receiving, holding and transporting a semiconductor wafer by increasing an effective coefficient of friction of the wafer to provide a secure resting point for such wafer during a transfer process while simultaneously increasing the speed thereof. Furthermore, a hole may be provided in the support device for attaching the support device, or a plurality of support devices having holes, to an end-effector.

25 Claims, 6 Drawing Sheets

COMPOUND ANGLED PAD END-EFFECTOR

BACKGROUND OF THE INVENTION

1. Field of the Invention

The present invention relates to a device and method for transporting a semiconductor wafer during processing, and more particularly, to a device and method having a plurality of angled surfaces for receiving, holding and transporting a semiconductor wafer during semiconductor processing.

2. Description of Related Art

During semiconductor manufacturing, the semiconductor wafer or substrate is typically moved to a processing module, or from one processing station to another. The wafer may be placed on a plurality of pad devices situated on a transfer arm. The pad devices assist in holding or supporting the wafer while being transported by the transfer arm.

Known pad devices typically have a wedge-shaped design whereby the pad devices are positioned on an end-effector, such as a transfer arm, used in semiconductor processing. The semiconductor wafer is then positioned on the pad devices and transported during processing.

A disadvantage of transferring wafers using current process flows and pad devices occurs when the receiving surface of the pad device touches the top or bottom surface area of the wafer, resulting in contamination thereof. As the wafer surfaces are developed during semiconductor processing, this contamination is undesirable as unwanted or residual particles remain on the wafer surfaces. Another disadvantage of current processing and pad devices is that when the wafer contacts a receiving surface of a pad device having a low rise, or relatively small angle from a respective horizontal plane, the receiving surface may also undesirably contact the bottom surface of the wafer resulting in contamination thereof. Additionally, other portions of the wafer, such as the edges, may be damaged using current processing and pad devices thereby causing difficulty when developing the semiconductor wafer.

Another undesirable aspect of known process flows and pad devices is that the wafer can shift on the pad device or transfer means while being transported. In so doing, the wafer slides and shifts on the pad device resulting in damage to the wafer, or further contact with, and contamination of, the bottom surface of the wafer. In shifting the wafer during transporting, physical damage may also occur to the wafer as a result of misalignment of the wafer causing surface of the wafer to undesirably contact unwanted objects. Such undesirable contact may render the wafer less desirable for processing or even result in discarding of the wafer, thereby reducing production yields. Misalignment of the wafer also may cause coatings or deposits of materials to be misapplied to the wafer, e.g., the film may be applied onto unwanted areas of the misaligned wafer and/or an undesirable film build-up can occur on the wafer, resulting in less productive surface areas of the wafer, or rejection thereof, leading to lower production yields.

Accordingly, a need exists in the art to provide improved process flows and transfer devices that neither contaminate nor damage the surfaces of a wafer during the process of both receiving and transporting the wafer, and doing so as rapidly as possible. Furthermore, as it is desirable to minimize the volume of the processing chamber, a need continues to exist in the art to provide improved pad devices having minimal vertical dimensions, thereby minimizing the required vertical clearance in the processing chamber.

Bearing in mind the problems and deficiencies of the prior art, it is therefore an object of the present invention to provide an improved support device and method for easily receiving and transporting a semiconductor wafer.

It is another object of the present invention to provide a support device and method which discourage movement of a semiconductor during transportation thereof.

It is yet another object of the present invention to provide a support device and method that discourage and reduce contamination of a wafer surface during transportation thereof.

It is a further object of the present invention to provide a support device having minimal vertical dimensions.

Another object of the invention is to provide a support device and method which more easily receives, holds, and transfers a semiconductor wafer.

It is a further object of the present invention to provide a support device and method for transferring a semiconductor wafer which minimize the vertical clearance needed in a processing chamber during placement of the wafer.

Still other objects and advantages of the invention will in part be obvious and will in part be apparent from the specification.

SUMMARY OF THE INVENTION

The above and other objects, which will be apparent to those skilled in art, are achieved in the present invention which is directed to in a first aspect, a support device for a wafer transfer process. The support device includes a first, second and third surfaces. The first surface is vertical while the second surface is horizontal and connected to the first surface. The third surface has at least two angled receiving surfaces and is connected to the first and second surfaces. On the third surface, one of the angled receiving surfaces has a steep angle of incline to increase an effective coefficient of friction of a wafer contacting the one angled receiving surface to provide a secure resting point for the wafer during a wafer transfer process while simultaneously improving the speed thereof. The support device also includes a pair of sidewalls connected to the first, second and third surfaces to form the instant support device.

In the first aspect, the support device may comprise a compound angled pad. Further, the steep angle of incline of the one of the angled receiving surfaces may be an acute angle ranging from about 30° to about 90° from a horizontal plane.

The instant support device may be made of a material having a naturally occurring surface roughness such as, for example, a ceramic, anodize aluminum and sapphire. Optionally, the support device may further include a hole in the third surface that traverses there-through the support device for attaching the support device to an end-effector.

In a second aspect, the invention relates to a compound angled support device for transporting a semiconductor wafer. The support device includes a first, second and third surfaces. The first surface is vertical while the second surface is horizontal and connected to the first surface. The third surface has a plurality of angled receiving surfaces and is connected to the first and second surfaces. The third surface includes a first receiving surface at a first acute angle from a first horizontal plane, a second receiving surface being contiguous with the first receiving surface and at a second acute angle from a second horizontal plane beneath the first horizontal plane, and third receiving surface being contiguous with the second receiving surface and at a third acute angle from a third horizontal plane beneath the second horizontal plane. On the third surface, at least one of the receiving surfaces has a steep angle of incline to increase an effective coefficient of friction of a wafer contacting the at least one receiving surface to provide a secure resting point for the wafer during a wafer transfer process while simultaneously improving the speed thereof. The support device also includes a pair of sidewalls connected to the first, second and third surfaces to form the instant support device.

In the second aspect, the steep angle of incline of the at least one receiving surface ranges from about 30° to about 90° from at least one of the horizontal planes to increase the effective coefficient of friction of the wafer. The instant support device may comprise a material having a naturally occurring surface roughness such as a ceramic, anodize aluminum and sapphire.

Preferably, the first acute angle of the first receiving surface ranges from about 5° to about 15° from the first horizontal plane, while the second acute angle of the second receiving surface ranges from about 30° to about 90° from the second horizontal plane and the third acute angle of the third receiving surface ranges from about 5° to about 15° from the third horizontal plane. In accordance with the preferred second embodiment, the second acute angle increases the effective coefficient of friction of the wafer.

Optionally, the instant support device may further include a hole in the first receiving surface that traverses through the support device for attaching the support device to an end-effector. The hole may further include a recessed portion within such hole. The end-effector may have a plurality of the compound angled support devices attached thereto within the recessed portion of the end-effector.

In a third aspect, the invention relates to a method for securing a wafer on a support device during a wafer transfer process. The method includes providing a compound angled support device which comprises a first surface being vertical and a second surface being horizontal. The second surface is connected to the first surface. The compound angled support device also comprises a third surface connected to the first vertical and the second horizontal surfaces. The third surface comprises at least a first angled receiving surface contiguous with a second angled receiving surface whereby the second angled receiving surface has a steep angle of incline. The compound angled support device further includes a pair of sidewalls connected to the first, second and third surfaces to form such compound angled support device.

In the method of the third aspect, a wafer is positioned on an edge thereof in a first position so as to directly contact the first receiving surface. The wafer is then moved to a second position so as the edge of the wafer directly contacts the second angled receiving surface. In so doing, an effective coefficient of friction of the wafer is increased by the wafer contacting the steep angle of incline of the second angled receiving surface to provide a secure resting point for the wafer during the wafer transfer process while simultaneously improving the speed thereof. The steep angle of incline of the second angled receiving surface may range from about 30° to about 90° from a horizontal plane to increase the effective coefficient of friction of the wafer.

Optionally, in the method, the third surface may comprise a plurality of contiguous angled receiving surfaces wherein at least one of the plurality of angled receiving surfaces has the steep angle of incline to increase the effective coefficient of friction of the wafer when the wafer is moved to the second position so as to directly contact the at least one of the plurality of angled receiving surfaces.

In the third aspect, the method may further include providing a hole in the first receiving surface whereby the hole traverses through the support device. In so doing, the support device may be attached to an end-effector by securing an attachment means into the hole. Optionally, a plurality of the compound angled support devices may be attached to the end-effector for receiving, holding and transferring the wafer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing preferred embodiments of the present invention, references will be made here into FIGS. 1–7B of the drawings in which like numerals refer to like features of the invention. Features of the invention are not necessarily shown to scale of the drawings.

The instant invention presents advantages relevant to the field of semiconductor processing by providing a process and support device having a plurality of angled surfaces for effectively receiving, holding and transporting a semiconductor wafer, while simultaneously improving the speed thereof. In accordance with the invention, the wafer is both received and transferred without contaminating or damaging surfaces of the wafer. Also, by maintaining the alignment of the wafer and avoiding contact with unwanted objects, the invention prevents movement or shifting of the wafer during the transportation process. As a result, subsequent coatings and deposits may be applied conformally only to those desired areas of the wafer. Advantageously, the invention also prevents damage to the edges and surfaces of the wafer. The invention provides improved pad devices having minimal vertical dimensions, thereby minimizing the required vertical clearance in the processing chamber. Accordingly, it has been found that the instant process and support device easily provide efficient and reliable semiconductor wafers and thereby increase the production yields thereof.

Figure 1A:
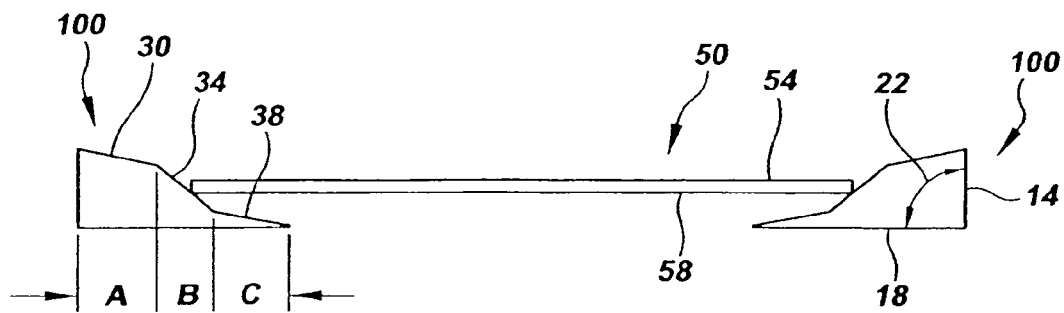
FIG. 1A is a side elevational view of a first embodiment of the support device of the present invention holding a semiconductor wafer.
Figure 1B:
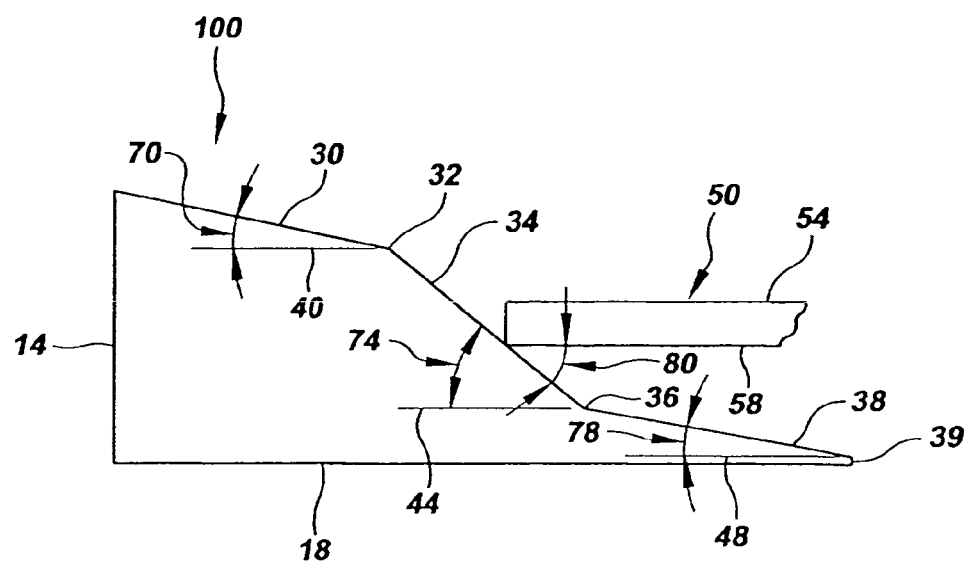
FIG. 1B is a side elevational view of a second embodiment of the support device of the invention holding a semiconductor wafer.

The instant invention will be better understood by the description below. Referring to a first embodiment as shown in FIGS. 1A and 1B, a preferred compound angled support device 100, preferably an angled pad, is shown having a wafer 50 positioned on the middle receiving surface 34 of angled support device 100. The instant process and angled support device are designed to receive, hold and transfer wafers having a variety of differing edges as known and used in the art. For example, the invention may be used to receive, hold and transfer a semiconductor wafer having edges that are square, beveled, rounded, and the like.

In a first embodiment, the support device 100, or angled pad, includes a vertical side 14 adjoining a horizontal side 18 and having preferably a 90° angle between them. The support device 100 preferably has two vertical sidewalls contiguously connected to the adjoining sides 14 and 18. The support device 100 also has a third generally inclined side including a plurality of angled receiving surfaces, preferably three angled receiving surfaces, contiguously connected to adjoining sides 14 and 18 and to the two sidewalls to form a solid structure or an angled pad. The three angled receiving surfaces include a first angled receiving surface 30 being uppermost in relation to the support device 100. The first angled receiving surface 30 includes a first angle 70 from a horizontal plane 40. The first angle 70 is preferably between about 5° to about 15°. The first receiving surface 30 is contiguously connected at a location 32 to a second angled receiving surface 34. The second angled receiving surface 34 defines a second acute angle 74 from a second horizontal plane 44 below horizontal plane 40. The second acute angle 74 is preferably between about 30° to about 90°. The second angled receiving surface 34 is contiguously connected at a location 36 to a third angled receiving surface 38. The third angled receiving surface 38 defines a third acute angle 78 from a third horizontal plane 48 whereby the third acute angle 78 is preferably between about 5° to about 15°. The third horizontal plane 48 is below the second horizontal plane 44. The third angled receiving surface 38 is preferably contiguously connected to a vertical leg 39 as shown in FIG. 1B, which in turn is contiguously connected to the horizontal base 18 of the support device 100. Alternatively, as shown in FIG. 1, the third angled receiving surface 38 may be contiguously connected to the horizontal base 18 to define therebetween the third acute angle.

Preferably, the wafer 50 may be positioned initially on the first angled receiving surface 30 or third angled receiving surface 38, and then subsequently moved to the second angled receiving surface 34. Moving the wafer can be implemented by manipulation of alignment cones 112 (shown in FIGS. 7B and 6B), or any other known means resulting in the wafer resting on the second angled receiving surface 34. The first 30, second 34, and third 38 angled receiving surfaces of the first embodiment shown in FIGS. 1A and 1B enable the wafer to be positioned initially and re-positioned either before or during transport on any of the three angled receiving surfaces 30, 34, 38.

As shown in FIG. 1A, the angled receiving surfaces within regions "A" and "C", i.e., angled receiving surfaces 30 and 38 respectively, are used for the initial pickup and delivery of the wafer, or the pre-aligning of the wafer. As such, in accordance with the invention, these angled receiving surfaces need only a small angle, such as, about 5° to about 15°. However, the angled receiving surface within region "B", i.e., angled receiving surface 34, is used for the final pickup and delivery of the wafer, or position at which the wafer is aligned and has an increased coefficient of friction. Accordingly, the angled receiving surface 34 requires a large or steep angle of incline, such as, about 30° to about 90°. Optionally, the wafer may be initially positioned on the angled receiving surface 34 so that such positioning is also the final, aligned position of the wafer for transferring the wafer into a processing chamber.

The instant support device may comprise a material that provides for roughened surfaces of the of the support device 100, i.e., roughened surfaces of the first, second, and third angled receiving surfaces. In so doing, the roughened surfaces provide increased friction when contacted with a semiconductor wafer. In accordance with the invention, the support device 100 may include a material which has a naturally occurring surface roughness including, for example, a ceramic (such as $Al_2O_3$), anodize aluminum, sapphire, and the like. Optionally, the support device 100 may be made of a material which must be coated with another material to form a surface roughness, or particulate surface roughness, thereon. However, as the coated or deposited particulate surface roughness will wear or degrade over time, thereby decreasing the friction coefficient, it is preferred that the support device 100 be made of a material having a naturally occurring surface roughness.

Figure 2:
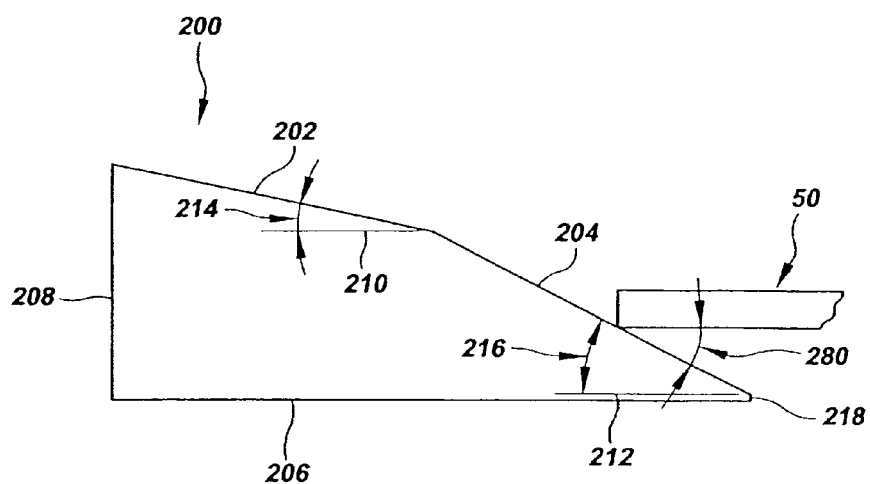
FIG. 2 is a side elevational view of a third embodiment of the support device of the invention holding a semiconductor wafer.

Alternatively, as shown in FIG. 2, in a second embodiment the support device 200, or angled pad, of the invention includes a first angled receiving surface 202 contiguous with a second angled receiving surface 204. The support device 200 includes a vertical side 208 contiguous with a horizontal bottom surface 206. The first angled receiving surface 202 is at an acute angle 214 from a horizontal plane 210 whereby the acute angle 214 is less than 15°, preferably between about 5° to about 15°. The first receiving surface 202 is contiguously connected to a second angled receiving surface 204. The second angled receiving surface 204 defines a second acute angle 216 from a second horizontal plane 212. The second acute angle 216 is preferably greater than 30°, more preferably between about 30° to about 90°. The second angled receiving surface 204 may be contiguously connected to a vertical leg 218, which in turn is contiguously connected to the horizontal base 206 of the support device 200, or alternatively, the second angled receiving surface 204 may be contiguously connected the horizontal base 206 to define the second acute angle therebetween.

In such an embodiment, a wafer may be positioned initially on the first angled receiving surface 202 and then moved to the second angled receiving surface 204. Alternatively, the wafer may be positioned initially and directly onto the second angled receiving surface 204.

In accordance with the invention, the steepest angled, roughened receiving surface of the instant support device, e.g., the second angled receiving surfaces (reference numeral 34 as shown in FIGS. 1A and 1B, and reference numeral 204 as shown in FIG. 2) provide the most secure resting point for the wafer 50 during the transport process. The wafer is positioned on at least one of its edges at a desirable point of contact on the roughened surface of the steepest angled receiving surface of the support device whereby such angled receiving surface discourages movement of the semiconductor wafer. This discouragement of movement is achieved by the steepness of the angle which dramatically increases the effective coefficient of friction, and thus does not rely on the material coefficient of friction, i.e., the surface aspects of the support device.

For example, a typical coefficient of friction for a wafer edge on a roughened receiving surface, e.g., ceramic ($Al_2O_3$), is about 0.21. In accordance with the invention, it has been found that by increasing the angle of incline of the receiving surface of a support device, e.g., a pad, the effective coefficient of friction for a wafer edge on the roughened receiving surface increases dramatically. That is, the extent to which the effective coefficient of friction increases is unexpected. Referring to FIG. 1B, wherein the acute angle 74 has a measure of 20°, the effective coefficient of friction for a wafer edge on the angled, roughened receiving surface 34 is about 0.31. When the acute angle 74 has a measure of 36°, the effective coefficient of friction for a wafer edge on the angled, roughened receiving surface 34 is about 0.55. Still further, when the acute angle 74 has a measure of 45°, the effective coefficient of friction for a wafer edge on the angled, roughened receiving surface 34 is about 0.77. Thus, in accordance with the invention, as the measure of the acute angle 74 increases, the effective coefficient of friction for a wafer edge on the angled, roughened receiving surface 34 also increases thereby providing a more secure resting point for the wafer, discouraging movement of such wafer, preventing contamination of the surfaces of the wafer and preventing damage to the edges and surface of such wafer. Likewise, the in-plane acceleration that the wafer can withstand without slipping is a linear function of this coefficient of friction for the wafer edge on the angled receiving surface. That is, using an angle 74 of 45° the coefficient of friction for a wafer edge on the angled receiving surface 34 is about 3.67 times greater than a wafer having a typical coefficient of friction of 0.21 for a wafer edge on a roughened receiving surface and, as such, the wafer may be accelerated 3.67 times faster than such typical wafer.

Furthermore, the instant support device has a minimal vertical height dimension 95 as required by the chosen processing chamber also having a reduced vertical clearance. Unexpectedly, it has been found that by using the compound angled configuration of the invention, that the steepest receiving surface angle may be large; i.e., up to 90°, while still maintaining a minimal vertical clearance or dimension. The support device may have a height dimension up to about 0.170 inches, or possibly even greater. Ideally, in determining the minimal vertical height dimension 95 of the instant support device, the horizontal projection of the steepest receiving surfaces, i.e., receiving surfaces 34, 204 and 334, is first chosen to encompass the capture region of the end-effector. The capture region is the largest spatial extent in which the wafer can be placed and still achieve a successful wafer transfer. The largest acute angle of such steepest receiving surface, i.e., angles 74 and 216, is then chosen as steep as necessary to provide the desired or required effective coefficient of friction of the wafer, such that the vertical height dimension of the resultant support device remains within the clearance of the vertical height dimension of the processing chamber. Thus, the minimal vertical height dimension of the instant support device enables access of the support device into a processing chamber having a reduced vertical clearance such as, for example, those processing chambers having vertical clearances below 0.350 inches.

As will be recognized in view of the description above, the advantages of support device 100 and 200, as shown in FIGS. 1A, 1B and 2, also apply to the embodiments of the instant support device as described below. As discussed further and shown in FIGS. 3A and 3B, the instant support device may include a plurality of varying angled surfaces at a variety of differing angles, whereby the steepest angle of incline provides the most secure resting point for a semiconductor wafer when being received and transferred.

Figure 3A:
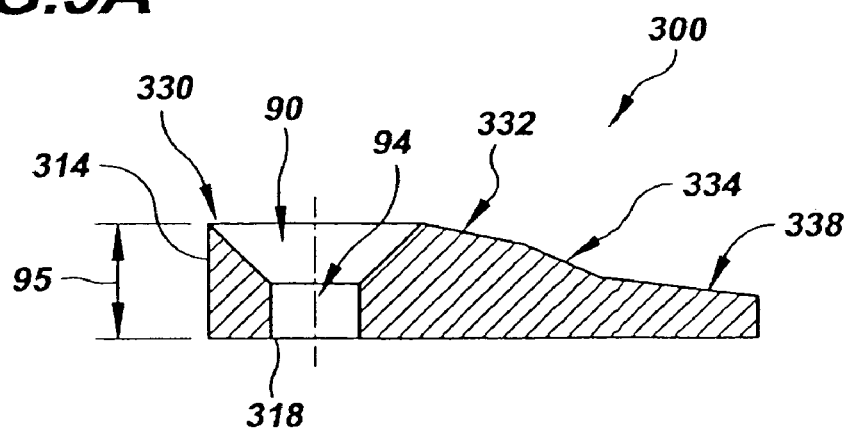
FIG. 3A is a side elevational view of a fourth embodiment of the support device of the invention holding a semiconductor wafer showing a line A—A'.
Figure 3B:
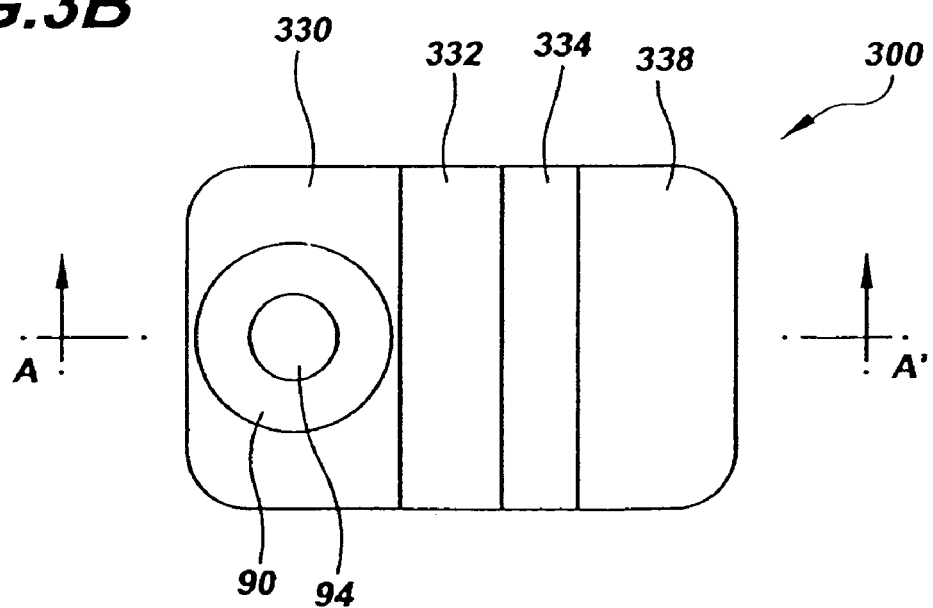
FIG. 3B is a top plan view of the support device of FIG. 3A along line A—A'.
Figure 4:
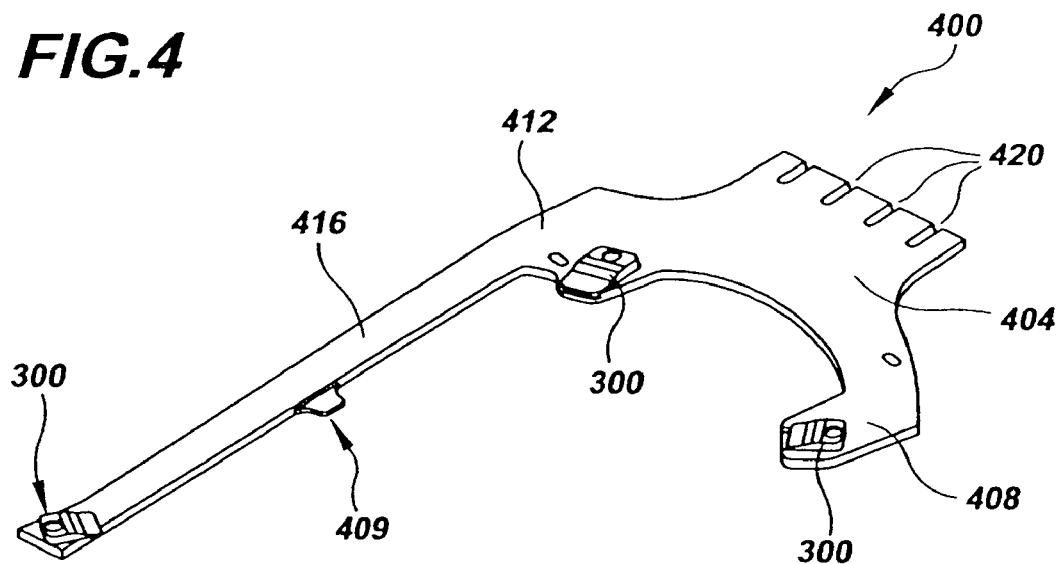
FIG. 4 is a perspective view of a semiconductor wafer transfer arm in accordance with the invention including the support device shown in FIG. 1.
Figure 6A:
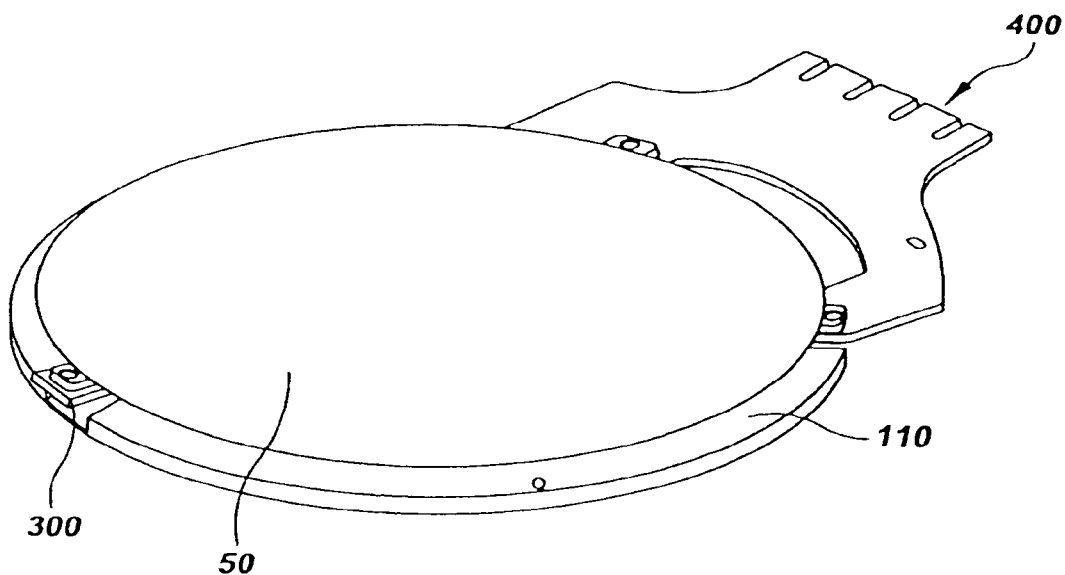
FIG. 6A is a perspective view of the semiconductor wafer transfer arm initially holding a semiconductor wafer on the instant support devices.
Figure 6B:
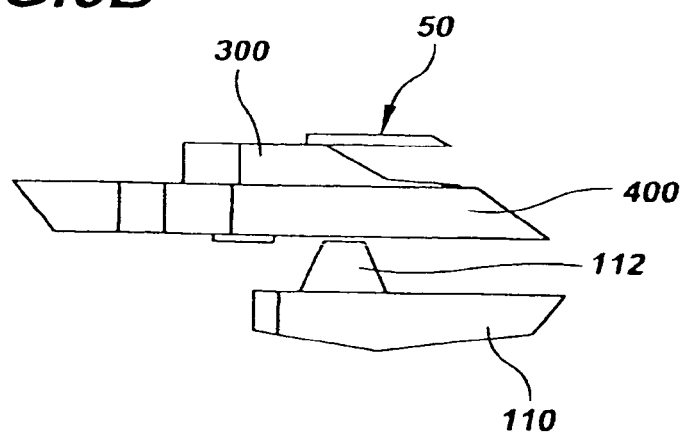
FIG. 6B is a side elevational view of FIG. 6A showing the wafer in an initial position on the instant support device and a wafer alignment cone.
Figure 7A:
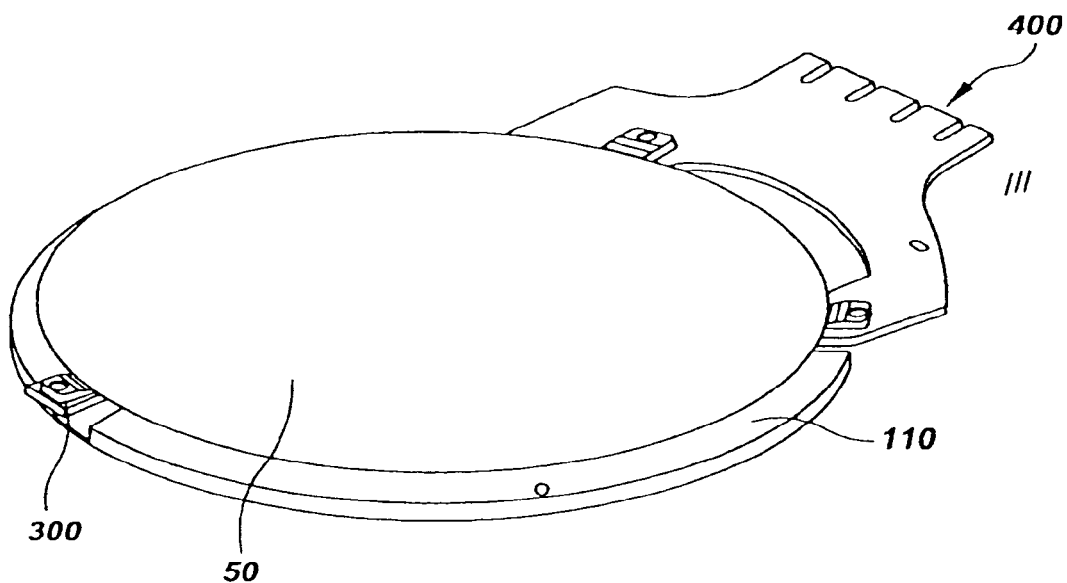
FIG. 7A is a perspective view of the semiconductor wafer transfer arm holding the semiconductor wafer on the instant support devices in a second position.

Referring to FIGS. 3A and 3B, a third embodiment of the instant support device 300 is shown having the horizontal 318 and vertical 314 surfaces and four angled receiving surfaces 330, 332, 334, and 338, respectively, whereby the steepest angle of incline, i.e., angled receiving surface 334, provides the most secure resting point for a semiconductor wafer during the transport process. As illustrated in the side cross sectional view (FIG. 3a) and top plan view along line A—A' (FIG. 3B) of support device 300, a hole 94 is defined therein angled receiving surface 330 for mounting and directly attaching the support device 300 to a transfer means. Alternatively, a plurality of the instant support devices may be secured to the transfer means as shown in FIGS. 4, 6A and 7A. The hole 94 traverses through the angled receiving surface 330, through the support device 300 and exits the horizontal surface 318 of the support device. Preferably, the hole 94 is drilled through the support device 300 so as to form a threaded hole having a diameter sufficient to accommodate the chosen attachment means such as, for example, a diameter up to about 0.125 inches, or greater.

The hole 94 may include a recessed portion 90, concentric with hole 94, for adapting hole 94 to receive an attachment means, such as, a screw, nut, and the like. In so doing, the recessed portion 90 may extend vertically to a distance of about 0.078 inches within hole 94, or preferably, the recessed portion 90 extends half the distance within hole 94. In accordance with the invention, the recessed portion may be increased or decreased to accommodate a variety of known attachment means, such as, a variety of different sized screw heads, different sized nuts, and the like. In providing a recessed portion within hole 94, the fastened attachment means, i.e., the screw, nut, and the like, may be flush with the top surface of the angled receiving surface 330 or may be recessed below the surface of angled receiving surface 330, therein both maintaining a planar surface area of the angled receiving surface 330. The attachment means is provided into hole 94 and is inserted into an opening on an end-effector, i.e., a transfer means, such as transfer arm 400 as shown in FIG. 4, so as to connect and secure the instant support device thereto the end-effector.

Figure 5:
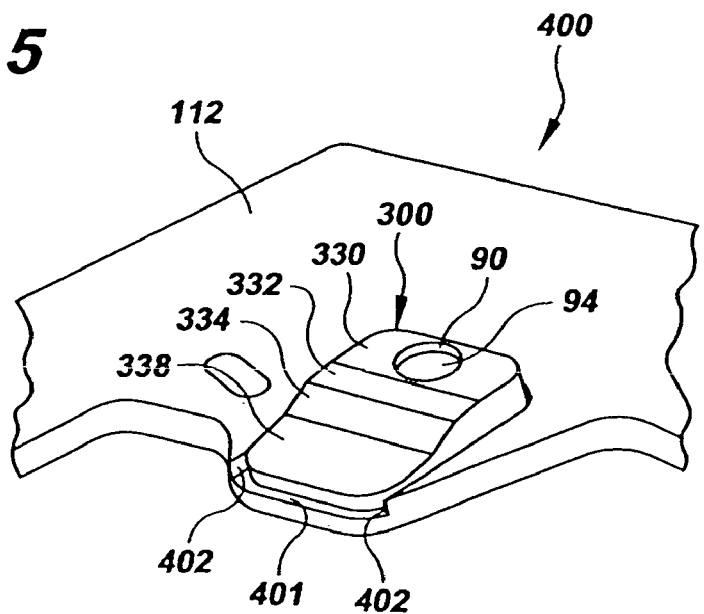
FIG. 5 is a perspective view of a portion wafer transfer arm of FIGS. 4 and 3A showing a support device in accordance with the invention.

The end-effector may comprise a semiconductor wafer transfer robotic arm 400 as illustrated in the perspective view of FIG. 4, and in the exploded view of FIG. 5 showing a support device in accordance with the invention. The transfer robotic arm 400 includes an attachment portion 404 having grooves 420 for adjustment and attachment to a secondary support robotic arm (not shown). The transfer arm also includes at least one alignment tab 409 for aligning the transfer arm or end-effector to a pedestal of a processing chamber (also not shown).

As illustrated, the transfer arm 400 preferably extends in a J-shape having an extended finger portion 416 attached to an end portion 412 thereof whereby end portion 412 is attached at the tip of the J-shaped transfer robotic arm to an end portion 408. The finger portion 416 extends outwardly and has attached at a distal end thereof the instant compound angled support device 300. The compound angled support device 300 on finger portion 416 is attached inward so as to face the two extending end portions 408 and 412. Likewise, extended end portions 408 and 412 also have attached, at an edge thereof, a compound angled support device 300 that faces inward toward the compound angled support device 300 on finger portion 416. In so doing, the three compound angled support devices all face each other for receiving, holding and transferring a semiconductor wafer on the angled surfaces of each of the support devices.

Further, as shown in FIG. 5, each of the instant compound angled support devices are preferably provided within a recessed portion 401 on the transfer robotic arm 400 to provide additional securing of each support device to the transfer arm 400. Thus, sidewalls 402 of the recessed portion on the transfer robotic arm secure the support device therein, in combination with the attachment means which secures the support device to the transfer arm, for additional securing of the support device to the transfer arm.

In receiving, securing and transferring a wafer using the instant support device, referring to FIGS. 6A–7B, an end-effector, such as transfer arm 400, is adapted to hold a semiconductor wafer by attaching thereto the end-effector a plurality of the instant support devices as described above. The transfer arm is positioned to receive a semiconductor wafer, and then the wafer is positioned on support devices 300 attached to the transfer arm 400. FIGS. 6A and 6B depict the initial transferring of the semiconductor wafer to the angled receiving surfaces of the support devices 300 on the wafer transfer arm. As shown, the transfer arm 400 is positioned on a receiving plate 110 which is positioned above and connected to alignment cones 112. The alignment cones 112 are adapted to receive the bottom of the transfer arm 400. The semiconductor wafer 50 may initially contact the first angled receiving surfaces 330, the second angled receiving surfaces 332, or the fourth angled receiving surfaces 338 of the support devices. FIG. 6B shows the wafer in its initial position on the first angled receiving surface 30.

Figure 7B:
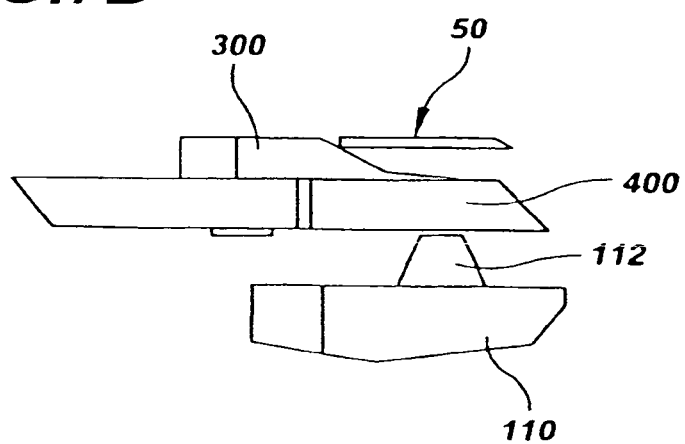
FIG. 7B is a side elevational view of FIG. 7A showing the wafer in a second position on the support device and the wafer alignment cone.

Once the semiconductor wafer is in full contact with the support devices 300, and held by the surfaces, the semiconductor wafer may be aligned to contact the third angled receiving surfaces 334, i.e., the steepest, angled receiving surface, so that the wafer is in its final position for subsequent processing steps. FIGS. 7A and 7B show the adjusted wafer in its second position. The wafer may be moved to align the wafer to the steepest, angled receiving surface by adjusting the alignment cones 112 via manipulation of the receiving plate 110. As discussed above, the steepest, angled receiving surface of the support device provides the most secure resting point for a semiconductor wafer during the transport process to thereby encourage the wafer to remain in place during high speed transporting, in addition to reducing particle contamination on the surfaces of the wafer. The semiconductor wafer may then be transported to another location, such as, being transported into a processing chamber. The minimal vertical dimension 95 of the instant support device enables the wafer to enter a processing chamber having reduced vertical clearance. After processing, the wafer is then removed from the instant compound angled support devices on the end-effector.

Accordingly, the discouragement of movement of the wafer is achieved by the instant support device by the frictional force created between an edge of the wafer directly contacting the steepest, angled, roughened receiving surface. By supporting the wafer on its edges on such receiving surface, the normal force acting upon the wafer is increased, thereby increasing the maximum frictional force in addition to linearly increasing the wafer transfer speed. The roughened surface of the steepest angled receiving surface also provides for additional static forces which further hold the wafer in place. Advantageously, the instant invention positions the wafer securely whereby the wafer is encouraged to remain in a predetermined or prefixed position when being moved at higher speeds or at greater acceleration. The invention also increases the speed at which the wafer is both received and transferred, thereby reducing the processing time and enhancing the assembly line process flow for wafer processing.

Another advantage of the present invention is that the steepest, angled, roughened receiving surface discourages particle contamination of the surfaces of a wafer during the transportation process. Referring to FIGS. 1B and 2, the steepest, angled receiving surface minimizes unwanted contact with and contamination of the top 54 and bottom 58 surfaces of the wafer 50. When an edge of the wafer is in contact with the steepest, angled receiving surface 34 or 204, an angle 80 or 280 respectively, is formed therebetween the surface of the wafer and the steepest angled receiving surface. Angles 80 and 280 form 90° angles respectively with angles 74 and 216. As angles 80 and 280 increase in degree measurements, the avoidance of particle contamination and damage to the surfaces of the wafer also increases as a result of the increased distance between the wafer surface and the second angled receiving surface. For example, wherein the wafer is angular in shape and includes a bottom corner at a right angle, this right angle contacts the second angled receiving surface to provide a near ideal point of contact between the two, thereby essentially eliminating and minimizing any unwanted contact with the bottom surface of the wafer. Particulate contamination is thereby avoided on the surfaces of the wafer to provide a wafer with maximum surface real estate availability for subsequent processing and development.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A support device for a wafer transfer process comprising:
   a first surface being vertical;
   a second surface being horizontal and connected to said first surface;
   a third surface having at least two angled receiving surfaces each with a roughened surface and connected to said first and second surfaces, whereby a first of said angled receiving surfaces having an angle of incline between about 5° to about 15° with respect to said horizontal surface is above and contiguous with a second of said angled receiving surfaces having a steep angle of incline between about 30° to about 90° with respect to said horizontal surface, said second angled receiving surface in combination with said roughened surface increasing an effective coefficient of friction of a wafer contacting said second angled receiving surface to provide a secure resting point for said wafer during said wafer transfer process while simultaneously improving the speed thereof and avoiding any contact with and contamination of a top and a bottom surface of said wafer; and
   a pair of sidewalls connected to said first, second and third surfaces to form said support device.

2. The device of claim 1 wherein said support device comprises a compound angled pad.

3. The device of claim 1 wherein said roughened surface comprises a material selected from the group consisting of Al$_2$O$_3$, anodize aluminum and sapphire.

4. The device of claim 1 further including a hole in said third surface and traversing through said support device for attaching said support device to an end-effector.

5. The device of claim 1 wherein said support device comprises a material having naturally occurring surface roughness to provide said third surface with said roughened surface thereof.

6. The device of claim 1 wherein said roughened surface of said third surface comprises a material coating having particulate surface roughness.

7. A compound angled support device for transporting a semiconductor wafer comprising:
   a first surface being vertical;
   a second surface being horizontal and connected to said first surface;
   a third surface having a plurality of angled receiving surfaces and connected to said first and second surfaces, said third surface at least comprising:
      a first receiving surface at a first acute angle between about 5° to about 15° from a first horizontal plane,
      a second receiving surface being below and contiguous with said first receiving surface and at a second acute angle between about 30° to about 90° from a second horizontal plane beneath the first horizontal plane,
      a third receiving surface being below and contiguous with said second receiving surface and at a third acute angle between about 5° to about 15° from a third horizontal plane beneath said second horizontal plane,
      wherein said angle of said second receiving surface has a steep angle of incline to increase an effective coefficient of friction of a wafer contacting said second receiving surface to provide a secure resting point for said wafer during a wafer transfer process while simultaneously increasing the speed thereof and avoiding any contact with and contamination of a top and a bottom surface of said wafer; and
   a pair of sidewalls connected to said first, second and third surfaces to form said support device.

8. The device of claim 7 further including a hole in said first receiving surface and traversing through said support device for attaching said support device to an end-effector.

9. The device of claim 8 further including a recessed portion within said hole.

10. The device of claim 9 wherein said end-effector has a plurality of said compound angled support devices attached thereto within said recessed portion of said end-effector.

11. The device of claim 7 wherein said support device comprises a material having naturally occurring surface roughness to provide said third surface with said roughened surface thereof.

12. The device of claim 11 wherein said material of said third surface having said naturally occurring surface roughness comprises anodize aluminum.

13. The device of claim 11 wherein said material of said third surface having said naturally occurring surface roughness comprises sapphire.

14. The device of claim 7 wherein said roughened surface of said third surface comprises a material coating having particulate surface roughness.

15. A method for securing a wafer on a support device during a wafer transfer process comprising:
   providing a compound angled support device comprising,
      a first surface being vertical,
      a second surface being horizontal and connected to said first surface,
      a third surface having a roughened surface and being connected to said first vertical and said second horizontal surfaces, said third surface comprising at least a first angled receiving surface being above and contiguous with a second angled receiving surface, whereby said first angled receiving surface has an angle of incline between about 5° to about 15° with respect to said horizontal surface while said second angled receiving surface has a steep angle of incline between about 30° to about 90° with respect to said horizontal surface,
      a pair of sidewalls connected to said first, second and third surfaces to form said compound angled support device;
   positioning an edge of a wafer in a first position so as to directly contact said first receiving surface; and
   moving said wafer to a second position so as said edge of said wafer directly contacts said second angled receiving surface whereby said steep angle of incline in combination with said roughened surface increases an effective coefficient of friction of said wafer to provide a secure resting point for said wafer during said wafer transfer process while simultaneously increasing the speed thereof and avoiding any contact with and contamination of a top and a bottom surface of said wafer.

16. The method of claim 15 wherein said third surface further includes a third angled receiving surface below and contiguous with said second angled receiving surface having an angle of incline between about 5° to about 15° from said horizontal surface.

17. The method of claim 15 further including providing a hole in said first receiving surface and traversing through said support device.

18. The method of claim 17 further including attaching said support device to an end-effector by securing an attachment means into said hole.

19. The method of claim 18 further including attaching a plurality of said compound angled support devices to said end-effector for receiving, holding and transferring said wafer.

20. The method of claim 18 wherein said end-effector comprises a wafer transfer arm having three of said support devices attached thereto, each of said support devices facing inward towards each other for receiving and holding said wafer.

21. The method of claim 20 wherein said wafer transfer arm includes three recessed portions for receiving and securing said three support devices.

22. The method of claim 15 wherein said compound angled support device comprises a material having naturally occurring surface roughness to provide said third surface with said roughened surface thereof.

23. The method of claim 15 further including coating at least said third surface of said compound angled support device with a material having particulate surface roughness.

24. The method of claim 15 wherein said roughened surface comprises anodize aluminum.

25. The method of claim 15 wherein said roughened surface comprises sapphire.

* * * * *

UNITED STATES PATENT AND TRADEMARK OFFICE
CERTIFICATE OF CORRECTION

PATENT NO. : 7,048,316 B1
APPLICATION NO. : 10/194529
DATED : May 23, 2006
INVENTOR(S) : Blank et al.

It is certified that error appears in the above-identified patent and that said Letters Patent is hereby corrected as shown below:

In column 5, line 36 thereof, "50" should read -- 5° --.

Signed and Sealed this

Twelfth Day of September, 2006

JON W. DUDAS
*Director of the United States Patent and Trademark Office*